United States Patent
Jorgensen

(10) Patent No.: US 9,176,764 B1
(45) Date of Patent: Nov. 3, 2015

(54) MANAGING MEMORY IN VIRTUALIZED ENVIRONMENTS

(71) Applicant: Amazon Technologies, Inc., Reno, NV (US)

(72) Inventor: Atle Normann Jorgensen, Cape Town (ZA)

(73) Assignee: Amazon Technologies, Inc., Reno, NV (US)

( * ) Notice: Subject to any disclaimer, the term of this patent is extended or adjusted under 35 U.S.C. 154(b) by 71 days.

(21) Appl. No.: 14/037,246

(22) Filed: Sep. 25, 2013

(51) Int. Cl.
*G06F 9/455* (2006.01)
*G11C 7/10* (2006.01)

(52) U.S. Cl.
CPC ............ *G06F 9/4555* (2013.01); *G11C 7/1072* (2013.01); *G06F 2212/151* (2013.01)

(58) Field of Classification Search
None
See application file for complete search history.

(56) References Cited

U.S. PATENT DOCUMENTS

| | | | |
|---|---|---|---|
| 6,594,749 B1 * | 7/2003 | Czajkowski | 711/170 |
| 8,893,123 B2 * | 11/2014 | Miyamoto et al. | 718/1 |
| 2010/0169536 A1 * | 7/2010 | Shedel et al. | 711/6 |
| 2010/0281477 A1 * | 11/2010 | Berlin | 718/1 |
| 2011/0053520 A1 * | 3/2011 | Imagawa et al. | 455/69 |
| 2013/0138863 A1 * | 5/2013 | Tsirkin et al. | 711/6 |
| 2013/0290595 A1 * | 10/2013 | Weissman et al. | 711/6 |
| 2014/0245294 A1 * | 8/2014 | Kaul, Yaniv | 718/1 |

* cited by examiner

*Primary Examiner* — Kris Rhu
(74) *Attorney, Agent, or Firm* — Hogan Lovells US LLP

(57) ABSTRACT

Techniques are described for enabling a virtual machine to be presented with an amount of available guest memory, where a hypervisor or other privileged component manages the mapping of the resources based at least in part on the capacity of resources one or more hosts. This enables resources to be effectively oversubscribed to on host computing devices that have a limited amount of total available resources but which are running multiple virtual machines. For example, each virtual machine on the device can be presented as having access to the total amount of available resources that are available on the device or more in some cases. In some cases, resources may be mapped to a plurality of hosts that have available resources.

20 Claims, 9 Drawing Sheets

MANAGING MEMORY IN VIRTUALIZED ENVIRONMENTS

BACKGROUND

As an increasing number of applications and services are being made available over networks such as the Internet, an increasing number of content, application, and/or service providers are turning to technologies such as cloud computing. Cloud computing, in general, is an approach to providing access to electronic resources through services, such as Web services, where the hardware and/or software used to support those services is dynamically scalable to meet the needs of the services at any given time. A user or customer typically will rent, lease, or otherwise pay for access to resources through the cloud, and thus does not have to purchase and maintain the hardware and/or software needed.

In this context, many cloud computing providers utilize virtualization to allow multiple users to share the underlying hardware and/or software resources. Virtualization can allow computing servers, storage device or other resources to be partitioned into multiple isolated instances (i.e. virtual machines) that are associated with (e.g., owned by) a particular user (e.g., customer). Conventionally, each virtual machine running on a host computing device is assigned a portion of memory (e.g., random access memory), processing capacity and/or other resources available on that device. However, some virtual machines frequently remain idle over relatively long time intervals, and only need access to their respective resources during short periods of time. During such idle time intervals, the resources which have been allocated to those virtual machines are generally not being utilized. In some cases, it would be desirable to utilize such unused resource capacity in some efficient way, without severely impacting the virtual machines during the times when they do need access to the resources.

BRIEF DESCRIPTION OF THE DRAWINGS

Various embodiments in accordance with the present disclosure will be described with reference to the drawings, in which.

DETAILED DESCRIPTION

Figure 1:
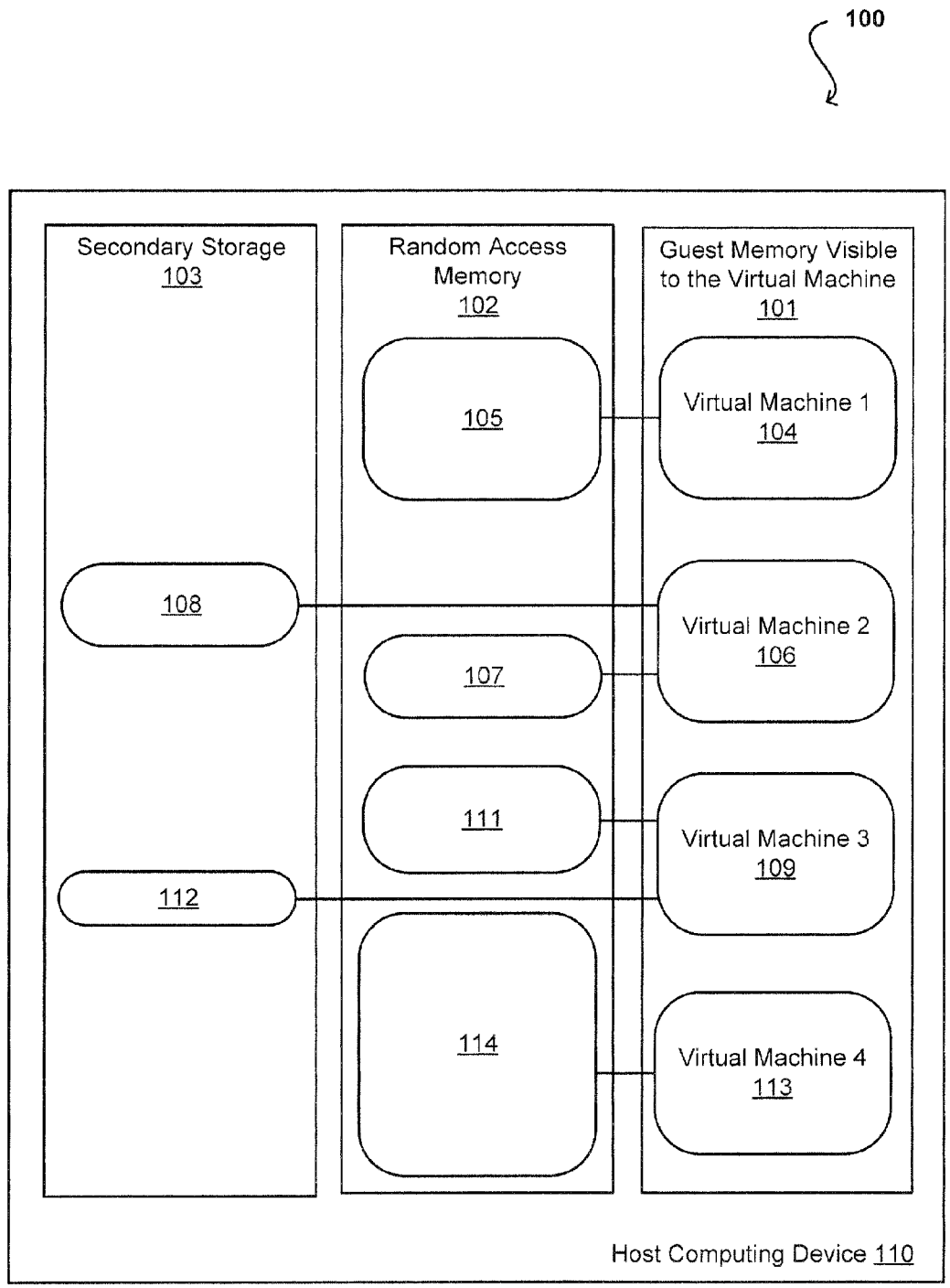
FIG. 1 illustrates an example of shaping memory for a virtual machine by mapping portions of memory to RAM and portions to secondary storage, in accordance with various embodiments.

In the following description, various embodiments will be illustrated by way of example and not by way of limitation in the figures of the accompanying drawings. References to various embodiments in this disclosure are not necessarily to the same embodiment, and such references mean at least one. While specific implementations and other details are discussed, it is to be understood that this is done for illustrative purposes only. A person skilled in the relevant art will recognize that other components and configurations may be used without departing from the scope and spirit of the claimed subject matter.

Systems and methods in accordance with various embodiments of the present disclosure may overcome one or more of the foregoing or other deficiencies experienced in conventional approaches for managing access to resources in a computing environment. In particular, various embodiments enable a virtual machine to be presented with an amount of available resources, where, for example, a hypervisor (also referred to as a virtual machine manager) or other privileged component manages the mapping of the available guest memory to either primary memory (e.g., random access memory (RAM)) or to secondary storage (e.g., a solid state drive (SSD)). From the perspective of the virtual machine, it can appear as though the virtual machine has access to an entire set of primary memory (e.g., RAM), while in reality the hypervisor (or other such component) may be mapping a portion of the available guest memory to RAM and another portion to one or more SSDs. This enables the primary memory (e.g., RAM) to be effectively oversubscribed on host computing devices that have a limited amount of total available primary memory but which are running multiple virtual machines. For example, each virtual machine on the device can be presented as having access to the total amount of available RAM that is available on the device. The hypervisor or other virtualization component then monitors the usage of the memory by each virtual machine and shapes which portions of the available guest memory for that virtual machine are mapped to RAM and which portions are mapped to secondary storage, such as SSD. In addition, a host computing device may comprise a memory pool, which herein is used to describe a portion of memory (e.g., RAM) that is not currently allocated to a virtual machine or other such device or object.

In various embodiments, the mapping of guest memory to primary memory and to secondary storage may be performed according to an algorithm, such as a "leaky bucket" type of algorithm. In some embodiments, the hypervisor (or other component) monitors the usage of the available memory by each virtual machine either continuously or periodically (e.g., over one or more time intervals). When the hypervisor detects that a particular virtual machine has been using a large amount of memory (e.g., larger than a threshold or other type of constraint), the hypervisor may begin to transfer portions of the memory assigned to the virtual machine to secondary storage, thereby increasing the portion of guest memory mapped to secondary storage. Similarly, when the hypervisor detects that the virtual machine has been using a lesser amount of memory (e.g., less than another threshold) over the time interval, the hypervisor may begin to gradually transfer portions of memory from secondary storage back to RAM, thereby increasing the portion of guest memory mapped to RAM.

In various embodiments described herein, a virtual machine may be configured to optimize the amount of resources available on at least one host by using as many resources as available on the at least one host when there is no contention for those resources, and using fewer or no resources when there is contention for resources on the at least one host. When there is contention for available resources on a given host, a hypervisor or other virtualization component may shape which portions of the available guest memory for that virtual machine are mapped to primary memory based on the capacity on the given host. A virtual machine such as that described above (also referred to herein as a "soaker instance" or a virtual machine that uses excess primary memory) may utilize guest memory that resides on a single host, a remote host, or a combination of hosts. When an algorithm implements oversubscription, such as a leaky bucket type algorithm, a virtual machine as described above may be used to supply additional memory as opposed to mapping additional memory to secondary storage. In some embodiments, a customer can submit a web services API call to stop a virtual machine from "leaking memory" (e.g., reallocating memory to secondary storage). A customer may be charged a one-time fee or pay increased fees based at least in part on an amount of time (e.g., fees per instance per hour, etc.). In some embodiments, a customer may be charged a lower amount/rate for using a virtual machine that reallocated memory to secondary storage, as opposed to the amount charged for a virtual machine that does not use secondary storage. This amount may be a flat fee, or may be based upon the amount and/or type of memory the virtual machine uses.

In various embodiments, a virtual machine may be launched along with information indicating whether the virtual machine will be configured to dynamically increase or decrease the amount of resources it uses based at least on contention for those resources (i.e., use excess primary memory). For example, a customer may use a web services API to designate what type of virtual machine to launch. In some embodiments, a policy and/or metadata may be associated with a customer that controls the virtual machine and/or the virtual machine that indicates to a host computing device and/or service provider what type of virtual machine is running and/or launched.

In some embodiments, a virtual machine that is not initially configured to dynamically increase or decrease the amount of resources it uses based on contention for those resources may be re-configured to be able to do so. For example, a virtual machine may be guaranteed a particular amount of resources, and when the guaranteed resources are exhausted, the virtual machine may be re-configured via an API or other management tool. In some embodiments, this re-configured type of virtual machine operates under different rules than the virtual machine did before it was re-configured. In some instances, a virtual machine that may dynamically increase or decrease the amount of resources it uses based on contention for those resources may operate on a first host, and then migrate to at least a second host that has available capacity. For example, when the first host experiences some type of resource contention, guest resources belonging to a virtual machine may migrate (completely or in part) to the second host which has additional capacity. In some embodiments, more than one virtual machine that may dynamically increase or decrease the amount of resources it uses based on contention for those resources may exist on one or more hosts at any given time, and these virtual machines may migrate between various hosts as needed to obtain additional resources. The one or more virtual machines that utilize resources based on contention for those resources may be opaque to a user, such that a system shows a user that they are using a virtual machine with guest resources that are dynamically allocated and will have access to additional resources, without indicating the location or capacity of the virtual machine. Of course, various cost models may be used in conjunction with these types of instances of virtual machines.

Similarly, in various embodiments, a virtual machine that is configured to dynamically increase or decrease the amount of resources it uses based on contention for those resources may be re-configured as a generic virtual machine (e.g., a virtual machine unable to dynamically increase or decrease the amount of resources it uses based on contention for those resources). For instance, a customer may submit an API call to cause such a reconfiguration. This type of reconfiguration, in some embodiments, may cause and/or require the reconfigured virtual machine to relocate to a different host computing device. In some embodiments a customer may be charged for this conversion and/or relocation, or it may be free of charge.

The processes of oversubscribing and shaping memory for virtual machines described above can be utilized within the context of a virtualized computing environment, such as a multitenant public or private cloud. In this type of environment, an operator of the virtualized computing environment (e.g., service provider) may provide access to physical resources, such as host computing devices, to its users (e.g., customers) and allow the users to execute their programs using the physical resources of the service provider. For example, each host computing device can include a hypervisor (or other virtualization component) that hosts one or more guest virtual machines. Each virtual machine can be owned by a particular user and can execute a service or application using the physical resources (i.e., host computing device) of the virtualized computing environment. The user can request, access and manage the virtual machine assigned to them via APIs and other management tools.

FIG. 1 illustrates an example 100 of an example approach to shaping memory for virtual machines by mapping portions of memory to RAM and portions to secondary storage and using one virtual machine that may dynamically increase or decrease the amount of resources it uses based on contention for those resources (virtual machine 4), in accordance with various embodiments.

Conventionally, the virtual machines on a host computing device are often assigned a portion of the available memory (e.g., RAM) on the device. For example, if the host computing device had one gigabyte of available RAM, and if the host computing device were running two virtual machines, each virtual machine might be assigned 500 megabytes of RAM (if memory were to be distributed evenly). In contrast, in various embodiments described herein, the virtual machines running on a host computing device may be presented with an amount of available memory that, in combination, exceeds the total amount of available RAM on the device. Following the example illustrated above, if the host computing device has one gigabyte of total available RAM, each of the two virtual machines running on the device may be presented as having access to the entire one gigabyte of addressable memory (e.g., guest memory). This is colloquially referred to herein as oversubscribing the memory of the host computing device because if the two virtual machines both simultaneously attempted to use the entirety of the available memory presented (e.g., made visible) to them, there would not be enough available RAM on the host computing device to support their operations. In order to account for such oversubscription, in some embodiments the virtual machine manager (e.g., hypervisor, etc.) may map a portion of the available memory to primary memory (e.g., RAM) and another portion of the available memory to secondary storage (e.g., SSD). In other embodiments described herein, a hypervisor (or other virtualization component) may re-configure a generic virtual machine into a virtual machine that may dynamically increase or decrease the amount of resources it uses based on contention for those resources in order to provide primary memory when there is contention for the primary memory on a host (e.g., by providing resources located on one or more additional hosts). A hypervisor (or other virtualization component) typically has full control over the page translation tables that map the virtual memory real physical memory and thus, the hypervisor can perform the memory shaping operations to map the different portions to RAM or secondary storage. Hypervisors and other virtualization components will be described in further detail later in this disclosure, with reference to FIGS. 5 and 6.

As shown in the illustration of FIG. 1, a virtual machine operating on a host computing device 110 can be presented with an amount of available guest memory 101. For example, virtual machine 1 may be presented as having available guest memory 104, while virtual machine 2 is presented as having available guest memory 106, virtual machine 3 is presented as having guest memory 109, and virtual machine 4 is presented as having guest memory 113. Each virtual machine may submit input/output (I/O) operations to access the memory made visible to them (or more memory in the case of virtual machine 4), and a hypervisor or other privileged component may be responsible for mapping the portions of guest memory to either primary memory or secondary storage opaquely with respect to the virtual machines (i.e., without exposing information about the memory being mapped in such a way to the virtual machines). In various embodiments, the primary memory is the area of memory that is determined to be more efficiently accessed by the central processing unit (CPU) than the secondary storage. For example, the primary memory may comprise random access memory (RAM), such as the RAM available in a dual in-line memory module (DIMM) embedded in a host computing device, which comprises a series of dynamic random-access memory integrated circuits. In various embodiments, the secondary storage may comprise any secondary storage location that can be accessible by the CPU of the host computing device, including but not limited to a solid state drive (SSD), flash memory, hard disks, optical drives, a memory location on a remote server accessible over a network connection, and the like.

In FIG. 1, the entire portion of guest memory 104 presented (e.g., made accessible) to virtual machine 1 is mapped to the portion of RAM 105. For virtual machine 2, a first portion 107 of the guest memory is mapped to RAM and a second portion 108 is mapped to secondary storage. Similarly, for virtual machine 3, a first portion 111 of the guest memory is mapped to RAM, while a second portion 112 of the guest memory is mapped to secondary storage. For virtual machine 4 (that may dynamically increase or decrease the amount of resources it uses based on contention for those resources), the entire portion of guest memory 113 is mapped to the portion of RAM 114.

In various embodiments, the hypervisor monitors the usage of the guest memory by a virtual machine over various time intervals. When the hypervisor detects that the usage by a particular virtual machine is exceeding a threshold (e.g., defined threshold, dynamically computed threshold, etc.), the hypervisor may begin to progressively increase the portion of guest memory of that virtual machine that is mapped to the secondary storage. When mapping guest memory to secondary storage, the hypervisor may begin to transfer (e.g., copy) one or more memory pages (e.g., memory blocks) from RAM to secondary storage. In one embodiment, the memory pages transferred to secondary storage may be the least frequently used (LFU) pages. For example, the system may keep track of the number of times a memory page is referenced in RAM, i.e., the reference frequency. When the hypervisor determines that some memory pages should be transferred from RAM to secondary storage, the system will copy the memory page(s) with the lowest reference frequency to secondary storage and then purge those memory pages from RAM. In alternative embodiments, the hypervisor may select the memory pages to be transferred by applying a different algorithm, such as by selecting random memory pages to transfer from RAM to secondary storage.

As discussed above, in some embodiments, when the hypervisor detects that the usage by a particular virtual machine is exceeding a threshold, the virtual machine may be re-configured into a virtual machine that may dynamically increase or decrease the amount of resources it uses based on contention for those resources. In some embodiments, a virtual machine may be configured in such a manner when it is instantiated With reference to this type of virtual machine depicted in FIG. 1 (virtual machine 4), portion 114 of the guest memory is mapped to RAM. In accordance with embodiments described herein, a virtual machine 4 may receive additional resources when needed based on the contention for resources on one or more hosts. For example, if additional RAM 102 is available to virtual machine 4, virtual machine 4's presented guest memory 113 may increase as portion 114 of the guest memory is mapped to the additionally available RAM 102.

In various embodiments, a virtual machine such as virtual machine 4 may launch on a first host and use available guest resources on the first host, then the such a virtual machine may migrate a portion or all of its guest resources to at least a second host. This may occur when contention for resources on the first host increases. In some embodiments, when a this type of virtual machine (e.g., virtual machine 4) is launched, it may utilize resources as long as there is excess capacity (e.g., on a single host or a plurality of hosts). When there is no excess capacity, this type of virtual machine may pause and/or hibernate. When additional capacity becomes available, a the virtual machine instance may re-launch and continue executing (e.g., where it stopped executing upon hibernation). In some embodiments, a virtual machine such as virtual machine 4 may be associated with a minimum amount of operating primary memory and a minimum amount of starting memory. If the amount of starting memory allocated falls below the minimum amount of operating primary memory, the virtual machine may be paused and/or hibernated. In accordance with various embodiments, a virtual machine manager may not start/re-launch the virtual machine until the virtual machine manager is able to provide the minimum amount of starting memory. In some cases, the minimum amount of starting memory is greater than the minimum amount of operating memory.

As illustrated in FIG. 1, the portions of guest memory mapped to either primary memory or secondary storage may change over time. In particular, the illustration in FIG. 1 shows an example of the memory mappings at one point in time and the illustration in FIG. 2 shows an example of the memory mappings at a different point in time, after which some memory shaping operations have been performed by the hypervisor.

Figure 2:
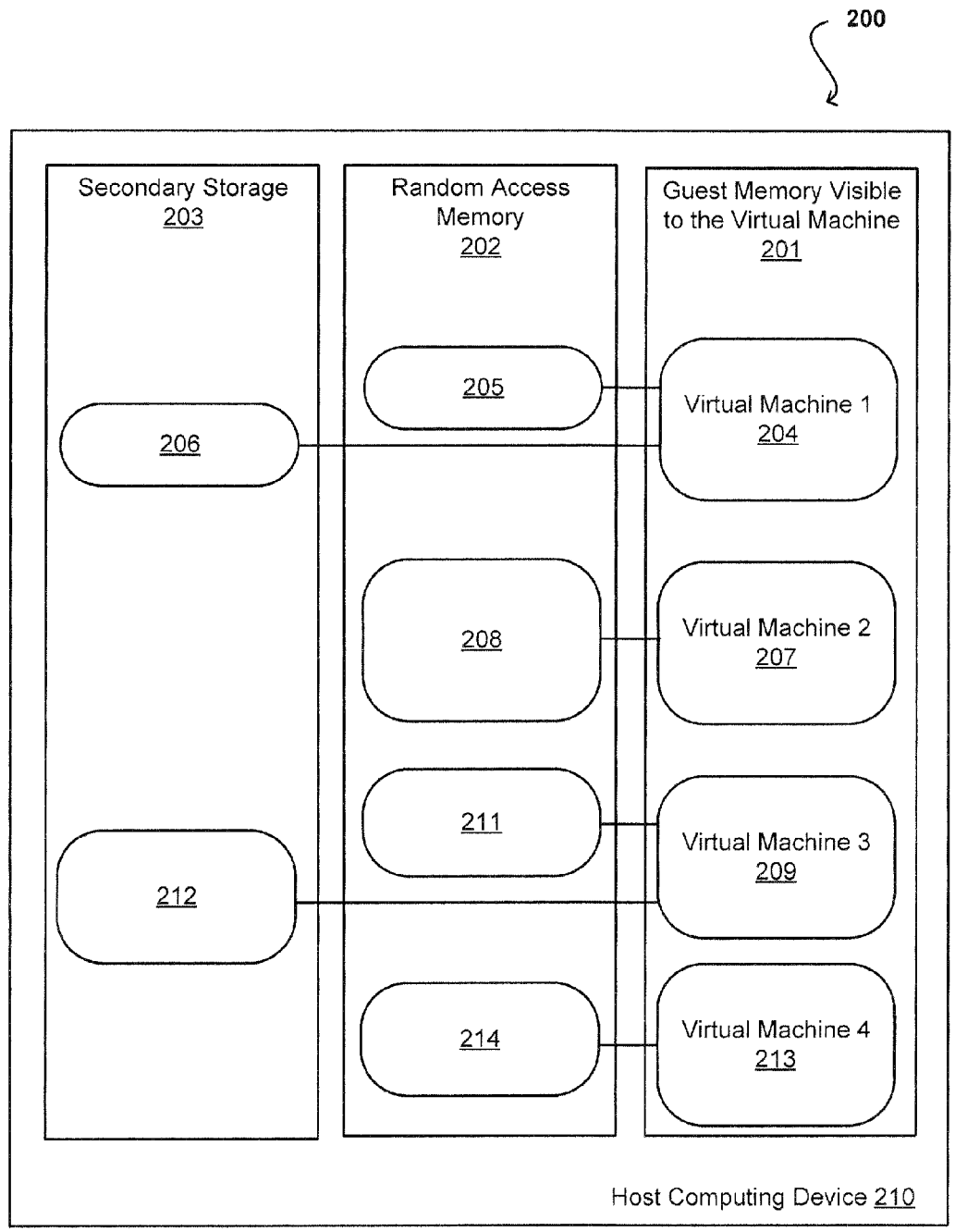
FIG. 2 illustrates an example where portions of guest memory have been mapped to secondary storage and other portions to RAM as a result of memory shaping operations by the hypervisor, in accordance with various embodiments.

FIG. 2 illustrates an example 200 where portions of guest memory have been mapped to secondary storage and other portions to RAM as a result of memory shaping operations by the hypervisor, in accordance with various embodiments. Comparing the illustrations of FIG. 1 to FIG. 2, the hypervisor has transferred a portion of virtual machine 1's memory pages to secondary storage 203. As a result of these memory shaping operations, in FIG. 2, a first portion 205 of the available guest memory 204 of virtual machine 1 is in RAM 202 and a second portion 206 of the available guest memory is mapped to secondary storage 203. Virtual machine 2 has been substantially idle and consequently, the hypervisor has transferred the entire portion 208 of its available guest memory into RAM. The usage of virtual machine 3 has remained relatively stable, and as a result, a larger portion 211 of guest memory of virtual machine 3 has been mapped to secondary storage, while a smaller portion 210 remains mapped to RAM. FIG. 2 also illustrates that an amount 214 of guest memory 213 of virtual machine 4 has decreased. In some embodiments, this is because the available RAM has decreased. It should be noted that the illustration shown in FIG. 2 is only one of many possible scenarios that may occur due to the memory shaping operations performed based on the memory usage by virtual machines. Further, in some embodiments an amount of guest memory available to virtual machine 4 does not decrease, even though the amount of available RAM has decreased. For instance, in some embodiments, a customer can submit a web services API call to stop his or her virtual machine from losing memory when a separate virtual machine is allocated additional memory, despite the fact that the particular virtual machine was configured to relinquish resources such as RAM when resource contention is detected. As with other virtual machine reconfigurations described herein, a customer may be charged for this, wherein charging a customer may be based at least upon a number of factors, including, but not limited to: type of reconfiguration required, an amount of time, whether a migration to another host occurs, etc.

Figure 3:
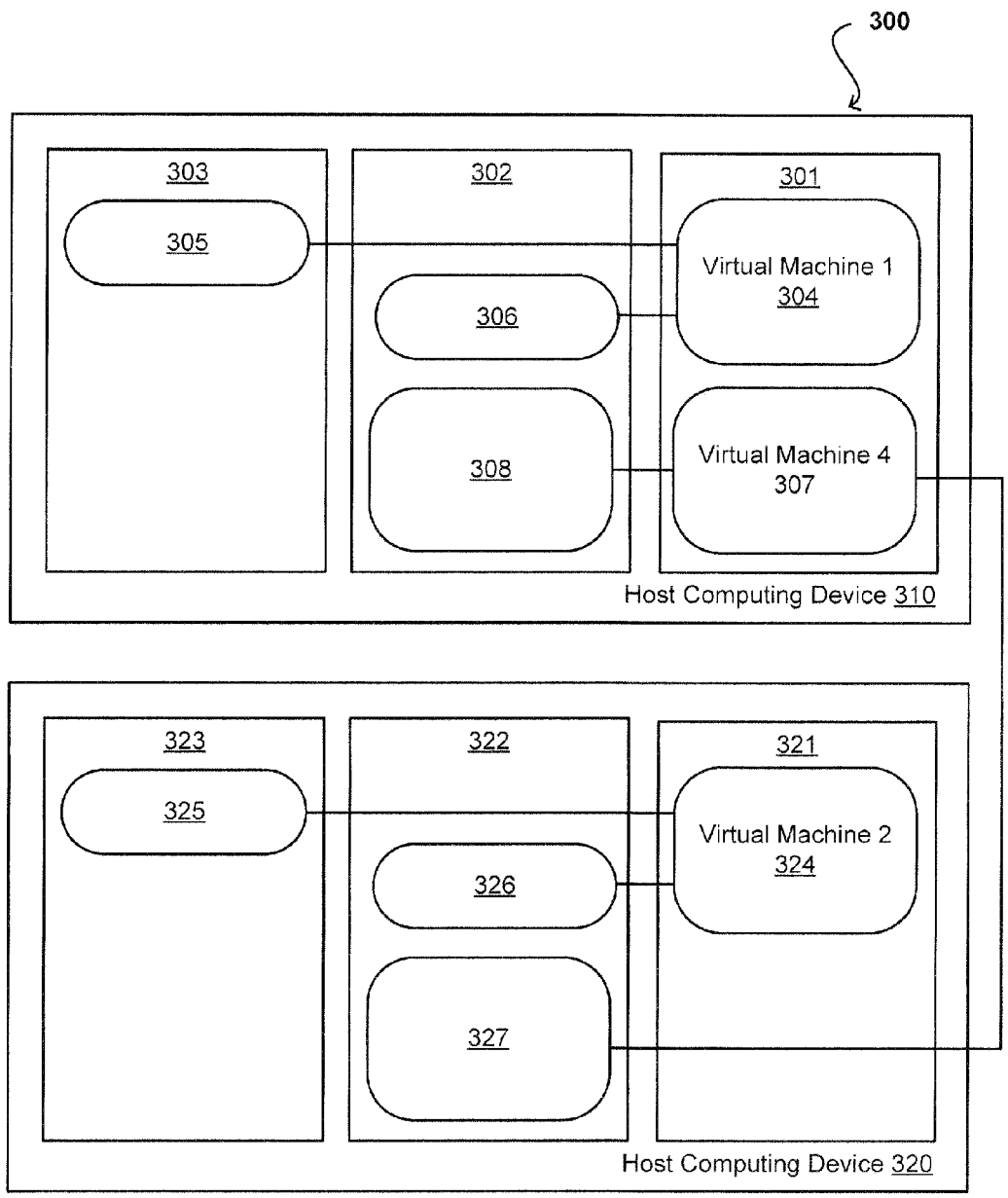
FIG. 3 illustrates an example of utilizing an example virtualization technique on more than one host computing device, in accordance with various embodiments.

FIG. 3 illustrates an example 300 where a virtual machine that may dynamically increase or decrease the amount of resources it uses based on contention for those resources (e.g., virtual machine 4) operates on more than one host computing device (310, 320). Again, it should be noted that the illustration shown in FIG. 3 is only one of many possible scenarios that may occur due to the memory shaping operations performed based on the memory usage by virtual machines.

In FIG. 3, host computing device 310 includes virtual machine 1 and virtual machine 4. Virtual machine 1 has a portion 305 of its guest memory 304 mapped to secondary storage 303, and another portion 306 of its guest memory to primary memory 302. Similarly, host computing device 320 includes virtual machine 2. Virtual machine 2 has a portion 325 of its guest memory 324 mapped to secondary storage 323 and a portion 326 mapped to primary 322 storage. In this example, virtual machine 4's guest memory 307 is mapped to both host computing devices' (310, 320) primary storage (302, 322). In various embodiments, when there is enough primary storage available in host computing device 310, rather than map to both host computing devices' primary memory (302, 322), virtual machine 4's guest memory may migrate such that it is mapped to a single host. In some embodiments, virtual machines that may dynamically increase or decrease the amount of resources it uses based on contention for those resources may start on a single host computing device, and later migrate all or some of their mapped guest memory to one or more host computing devices. Such a virtual machine may "grow" to occupy all the primary memory available to it, for example. As discussed above, this process may be opaque to a user and/or virtual machine.

Figure 4:
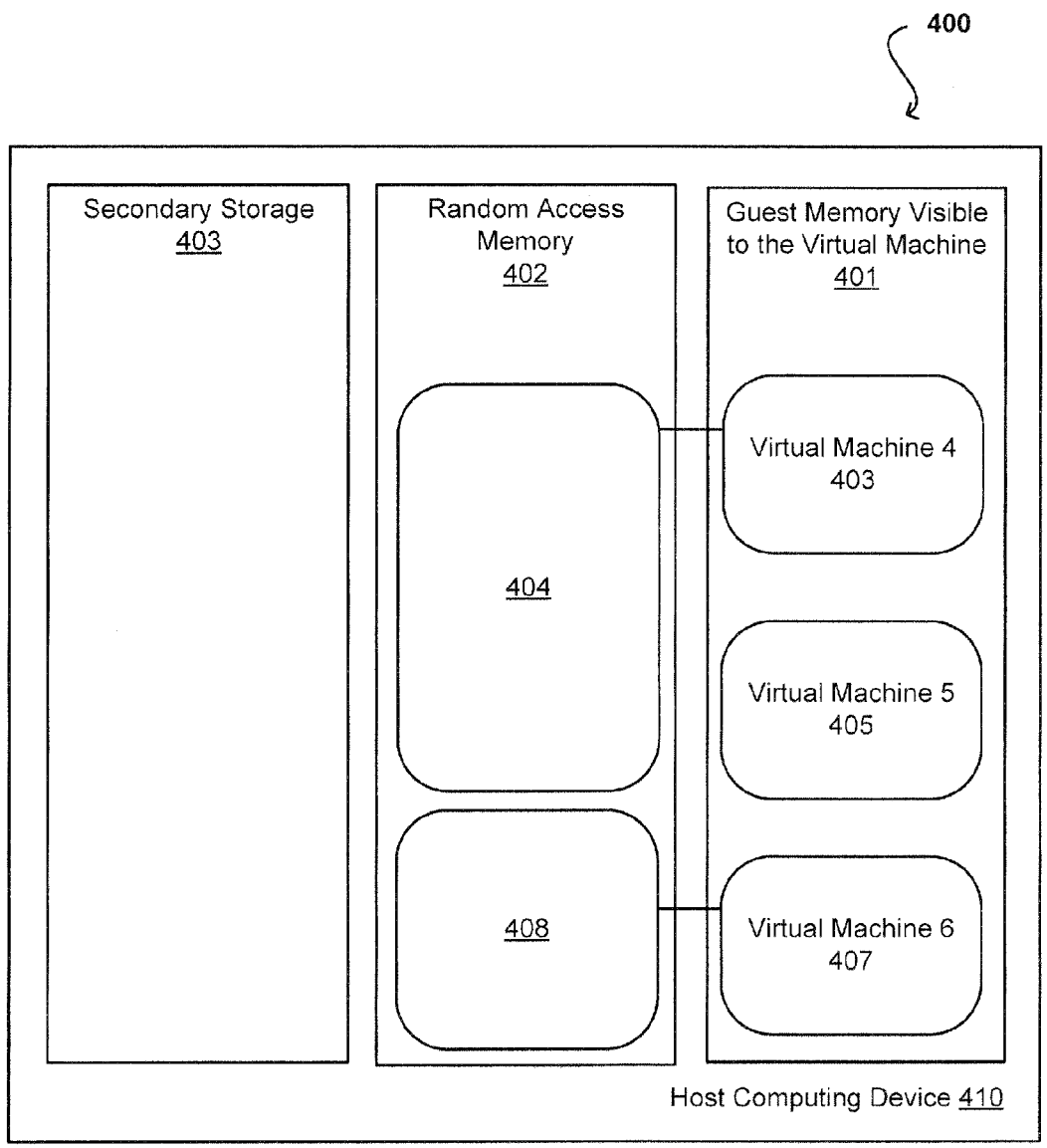
FIG. 4 illustrates an example of utilizing an example virtualization technique on a host computing device by allocating resources away from a particular area, in accordance with various embodiments.

In various embodiments, generic virtual machines may be-reconfigured in order to migrate the resources they use out of a particular area (e.g., secondary storage). FIG. 4 shows an example 400 of virtual machines that may dynamically increase or decrease the amount of resources they use based on contention for those resources (e.g., virtual machine 4, virtual machine 5, and virtual machine 6) being used which fill the primary storage 402 to capacity, rather than use secondary storage 403. In some embodiments, secondary storage (e.g., SDD, hard disk drives, etc.) may be replaced with another storage device while its resources are not being utilized. By using virtual machines which may dynamically decrease or increase the amount of resources they contend for, none of virtual their guest memory (403, 405, 407) is mapped to secondary storage and instead is mapped to portions of primary storage (404, 408).

In various embodiments, virtual machines that may dynamically increase or decrease the amount of resources they use based on contention for those resources have different priorities. Some virtual machines may grow to have access to all available memory, while others may shrink such that they have access to no memory. In some embodiments, virtual machines as described above have priority levels which are associated with the amount of resources available to one or more of these virtual machines. For example, with reference to FIG. 4, virtual machine 4 may have the highest priority, virtual machine 5 may have the lowest priority, and virtual machine 6 may have a priority in between virtual machines 4 and 5. In various embodiments, the DOM-0 may control the rules associated with virtual machines and their priority levels. For example, the priority of a virtual machine may be based at least in part upon the amount a user paid for their virtual machines virtual machines that may dynamically increase or decrease the amount of resources they use based on contention for those resources and the policies the DOM-0 creates.

It should be born in mind that, although memory is discussed throughout this specification, in various embodiments virtual machines may contend for/utilize other resources such as CPUs or DSPs using rules similar to those described above with reference to allocating memory.

In at least some embodiments, each virtual machine may be allowed a certain amount of memory (e.g., RAM) use per time unit. In some embodiments, a virtual machine may charge for CPU cycles. This may be helpful when a user does not know how many resources they will be afforded because they are using a virtual machine that may dynamically increase or decrease the amount of resources they use based on contention for those resources.

In at least some embodiments, the amount of RAM allocated to each virtual machine may be dependent on the priority associated with the virtual machine. For example, higher priority virtual machines may be allocated a higher amount of allowable RAM per time interval than lower priority virtual machines. Alternatively, higher priority virtual machines may not be subject to a limit at all and may be allowed to map all of their memory I/O operations to RAM. The priority of the virtual machine may be assigned based on the user/customer that owns the virtual machine. In some embodiments, a customer may selectively opt in to a virtual machine that may dynamically increase or decrease the amount of resources they use based on contention for those resources and have portions of their instance's memory mapped to a that virtual machine in order to reduce the price paid for the virtual machine.

Figure 5:
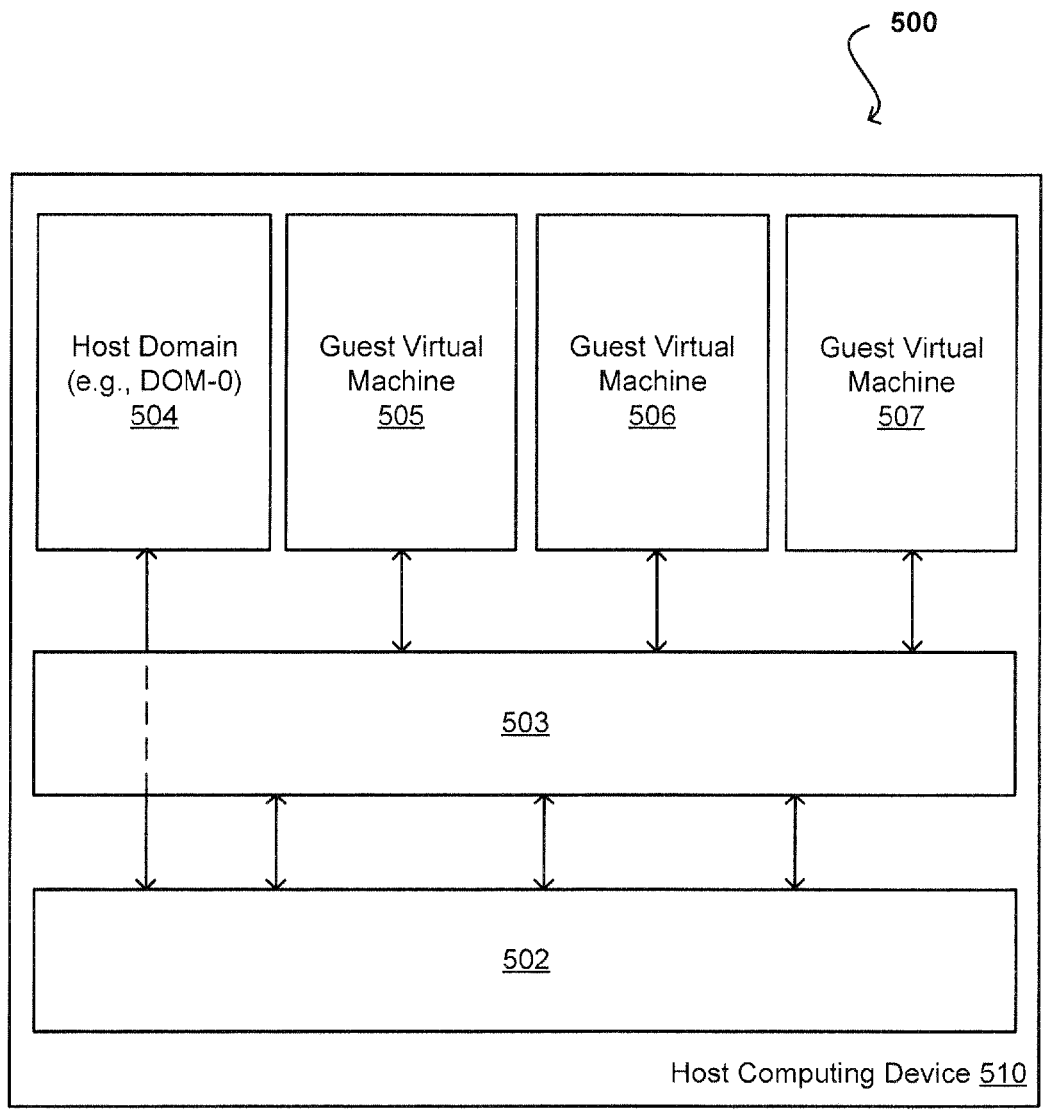
FIG. 5 illustrates an example of utilizing one virtualization technique on a host computing device by using a hypervisor, in accordance with various embodiments.

As previously mentioned, a virtual machine may be operating on a host computing device that resides in a resource center of a service provider or other operator of the virtualized computing environment. On the host computing device, a number of virtualization techniques can be used to simultaneously operate a plurality of guest virtual machines or guest operating systems. FIG. 5 illustrates an example 500 of utilizing one virtualization technique using a hypervisor, in accordance with various embodiments. The hardware 502 of the host computing device 510 interfaces with a hypervisor 503 running directly on the hardware 502 (e.g., a "bare metal" or native hypervisor). Examples of such hypervisors include Xen, Hyper-V®, and the like. Hypervisors typically run at a higher, more privileged processor state than any other software on the machine, and provide services such as memory management and processor scheduling for dependent layers and/or domains. The most privileged of such layers and/or domains resides in the service domain layer, which may include a host domain 504 that may include an administrative operating system for configuring the operation and functionality of the hypervisor 503, as well as that of domains of lower privilege, such as the domains of the guest virtual machines (505, 506, 507) or other operating systems, which may be heterogeneous (e.g., running different operating systems than each other). The host domain 504 (e.g., DOM-0) may have direct access to the hardware resources 502 of the host computing device 510 by way of the hypervisor 503, while the guest virtual machine domains (505, 506, 507) may not.

In various embodiments, the hypervisor 503 manages the mappings of virtual memory to physical memory in order to enable operations by the guest virtual machines (505, 506, 507). The hypervisor 503 has full control over the memory translation tables and is therefore able to remap virtual memory allocated to a virtual machine from RAM to secondary storage and vice versa. Because the virtual machines are not provided the mapping information, the hypervisor may remap the virtual memory opaquely with respect to the virtual machines.

Figure 6:
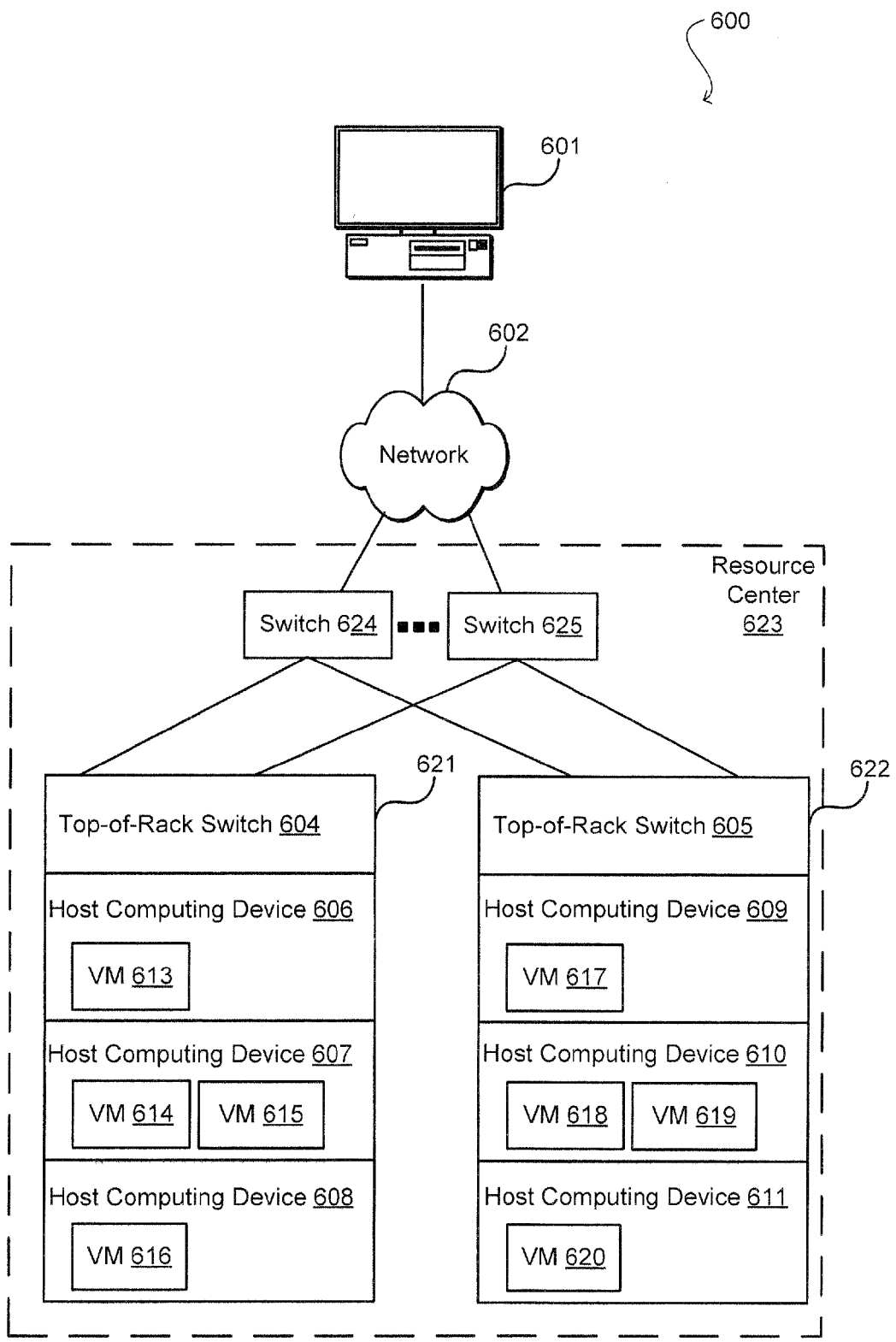
FIG. 6 illustrates an example of a resource center of a service provider that provides the physical resources that can be used to enable a virtualized computing environment, in accordance with various embodiments.

FIG. 6 illustrates an example 600 of a resource center of a service provider that provides the physical resources that can be used to enable a virtualized computing environment, in accordance with various embodiments. In the illustrated embodiment, a service provider (or other operator of the virtualized computing environment) can maintain one or more resource centers 623 (e.g., data centers, server farms, etc.) that store the physical resources (e.g., host computing devices, etc.) of the service provider. The resource centers may be located in different geographic locations to provide improved redundancy and failover, as well as more localized access to resources. The physical resources can be used to host a number of virtual machines or virtual servers that can be provided to users 601 over a network 602, such as the Internet. For example, when a user wants to execute an application using the physical resources of the service provider, he or she may request the service provider to provision a virtual machine for the user, which will be used to deploy and execute the application. As demand for the user's application grows, the user can request that more virtual machines be provisioned to balance the load, request creation of one or more virtual networks and the like.

In the illustrated example, the resource center 623 of the service provider may include one or more racks 621, 622 of host computing devices (606, 607, 608, 609, 610, 611) wherein each host computing device on a particular rack is connected to a single top-of-rack (TOR) switch (604, 605). These TOR switches can be further connected to one or more other switches (624, 625) which enable the host computing devices to connect to the network. As used throughout this disclosure, a network can be any wired or wireless network of devices that are capable of communicating with each other, including but not limited to the Internet or other Wide Area Networks (WANs), cellular networks, Local Area Networks (LANs), Storage Area Networks (SANs), Intranets, Extranets, and the like. The resource centers can include any physical or logical grouping of resources, such as a data center, a server farm, content delivery network (CDN) point-of-presence (POP) and the like.

In accordance with an embodiment, each host computing device can host one or more virtual machine instances (613, 614, 615, 616, 617, 618, 619, 620) that have been provisioned for the users (e.g., customers) of the service provider to execute the various applications and services on behalf of those users. Each virtual machine can be provisioned with its own operating system (OS) including a kernel, drivers, process management and the like.

When a user (e.g., customer) wishes to obtain a virtual machine instance, the user can first submit a request to the service provider, indicating the type of VM they would like to use (e.g., a virtual machine that may dynamically increase or decrease the amount of resources it uses based on contention for those resources). The service provider (or other operator) may carry out the processes to provision the virtual machine instance which will be hosted on the physical resources (e.g., host computing devices) of the service provider. After the virtual machine has been provisioned, the user may access the virtual machine using one or more application programming interfaces (APIs) provided by the operator of the virtualized environment. The user may use those APIs to manage their virtual machine and to perform various functions associated with the virtual machine (e.g., start the virtual machine, stop or suspend the virtual machine, specify or update configuration information for the virtual machine, etc.).

Figure 7:
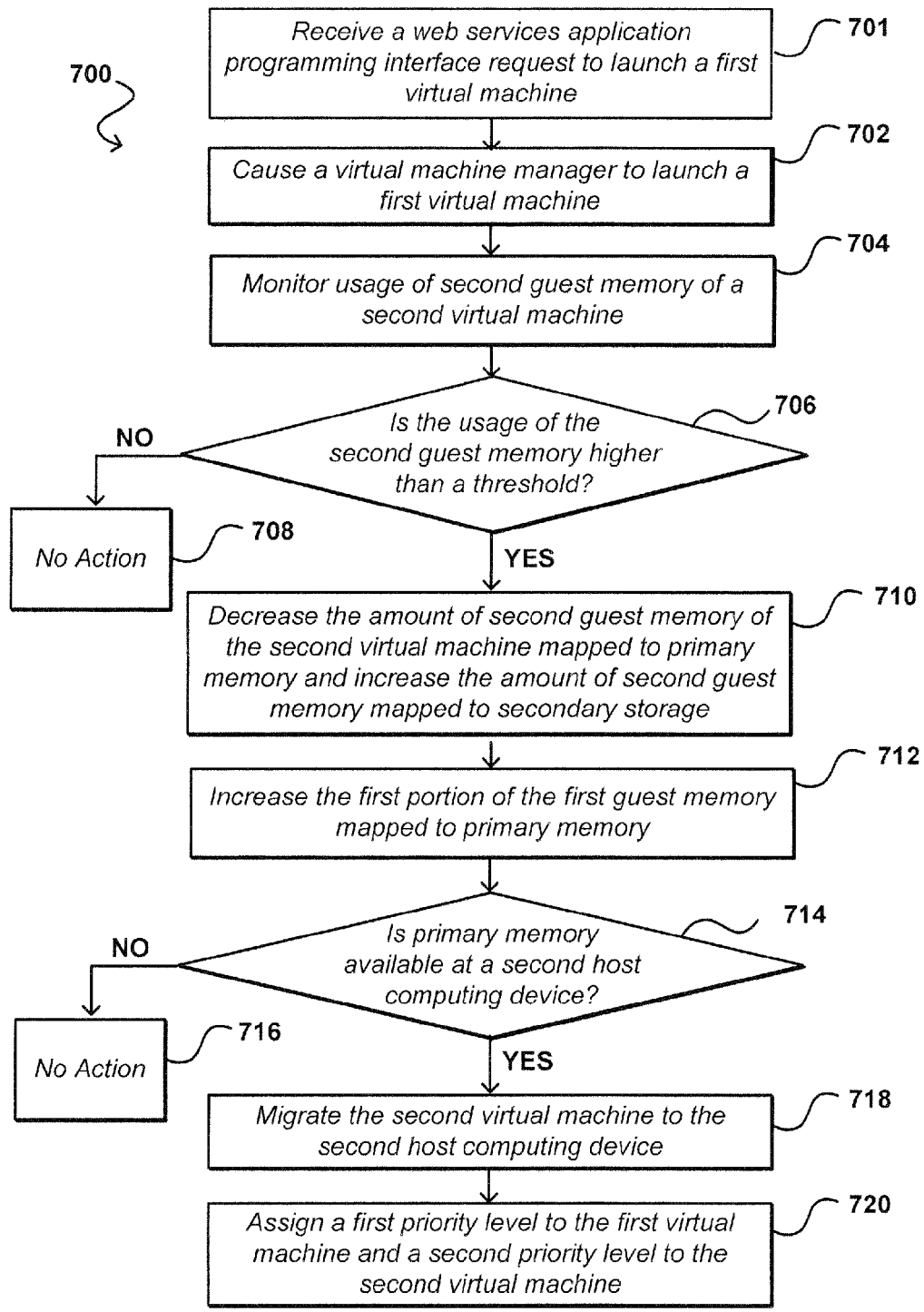
FIG. 7 illustrates an example process for increasing a portion of a virtual machine's memory mapped to random access memory based on usage, in accordance with various embodiments.

FIG. 7 illustrates an example process 700 for implementing virtual machines configured to consume excess capacity, in accordance with various embodiments. Although this figure may depict functional operations in a particular sequence, the processes are not necessarily limited to the particular order or operations illustrated. One skilled in the art will appreciate that the various operations portrayed in this or other figures can be changed, rearranged, performed in parallel or adapted in various ways. Furthermore, it is to be understood that certain operations or sequences of operations can be added to or omitted from the process, without departing from the scope of the various embodiments. In addition, the process illustrations contained herein are intended to demonstrate an idea of the process flow to one of ordinary skill in the art, rather than specifying the actual sequences of code execution, which may be implemented as different flows or sequences, optimized for performance, or otherwise modified in various ways.

In operation 701, in accordance with various embodiments, a web services application programming interface (API) request is received to launch a first virtual machine. As discussed above, an API allows a customer to control their virtual machine, in various embodiments.

In operation 702, a virtual machine manager is caused to launch a first virtual machine. In various embodiments, the first virtual machine has a portion of first guest memory mapped to primary memory (e.g., RAM), and a second portion of the first guest memory mapped to secondary storage (e.g., a solid state drive (SSD), flash memory, hard disks, optical drives, a memory location on a remote server accessible over a network connection, etc.) In some embodiments, information stored in primary memory can be retrieved at a lower latency than information stored in secondary storage.

In operation 704, in accordance with various embodiments, the usage of a second guest memory of a second virtual machine is monitored. In various embodiments, a first portion of the second guest memory is mapped to primary memory (e.g., RAM), and a second portion of the second guest memory is mapped to the secondary storage. (e.g., a solid state drive (SSD), flash memory, hard disks, optical drives, a memory location on a remote server accessible over a network connection, etc.)

In operation 706, in accordance with various embodiments, a determination is made as to whether the usage of the second guest memory is higher than a threshold. This threshold may be set by a customer, set by a service provider, associated with a particular customer, or associated with a particular instance (e.g., virtual machine). In some embodiments the threshold is predetermined, while in others the threshold may dynamically change. For instance, a threshold may change based at least in part on the amount of primary memory being used. If the usage of the second guest memory is not higher than a threshold, in accordance with various embodiments, in operation 708, no action occurs as a response to the second guest memory not being higher than a threshold. If the usage of the second guest memory is higher than a threshold, in accordance with various embodiments, in operation 710, an amount of second guest memory of the second virtual machine mapped to primary memory is decreased and the amount of second guest memory mapped to secondary storage is increased.

In operation 712, in accordance with various embodiments, a first portion of the first guest memory mapped to primary memory is increased. In various embodiments, the increase in the first guest memory is mapped to primary memory that was previously in use by another virtual machine.

In operation 714, in accordance with various embodiments, a determination is made as to whether primary memory is available at a second host computing device. In various embodiments, if primary memory is not available at a second host computing device, at operation 716 no action is taken as a result of primary memory not being available at a second host computing device. If there is primary memory available at a second host computing device, in operation 718, in accordance with various embodiments, a second virtual machine is migrated to the second host computing device. In some embodiments, as discussed above, available memory, primary or otherwise, on a plurality of host computing devices may be mapped to guest memory of a first or second virtual machine.

Figure 8:
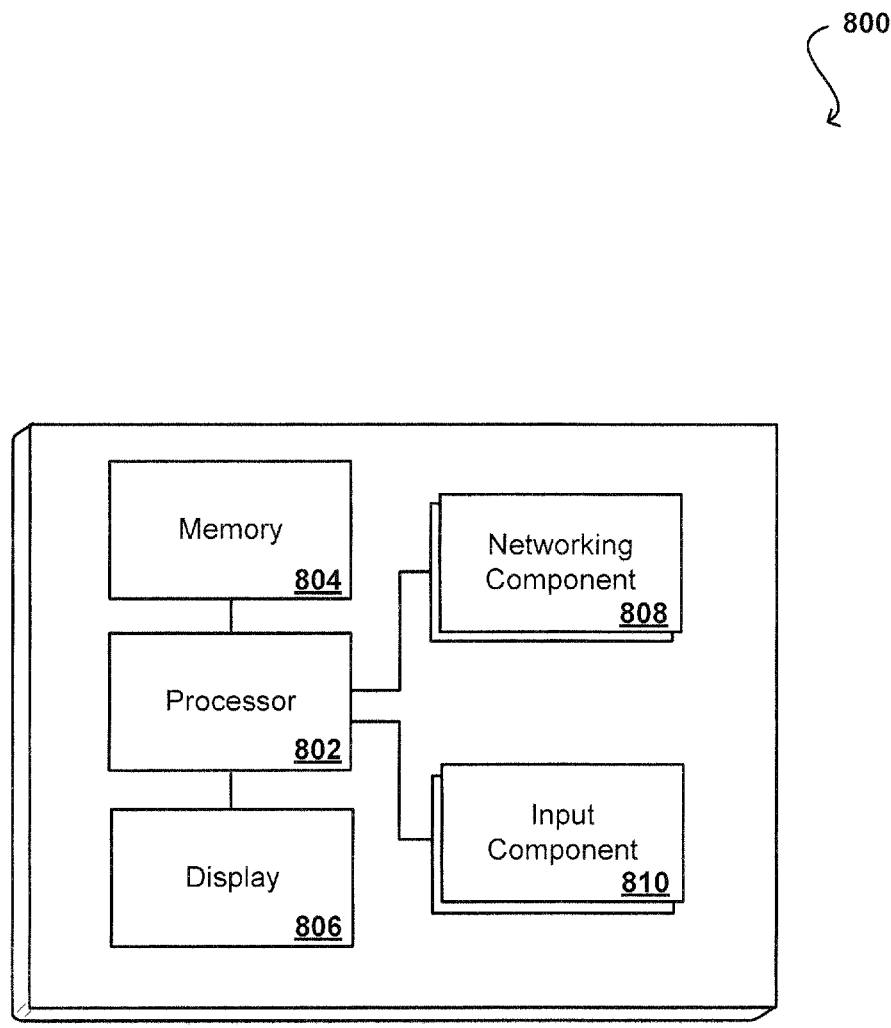
FIG. 8 illustrates a logical arrangement of a set of general components of an example computing device that can be utilized in accordance with various embodiments.

In operation 720, in accordance with various, a first priority level is assigned to a first virtual machine and a second priority level is assigned to a second virtual machine, wherein amounts of primary memory mapped to the first guest memory and to the second guest memory are based at least in part on the first priority level and the second priority level. In some embodiments, more than two virtual machines may be provided with priority levels that may be used to determine the amount of resources used by a particular virtual machine at a particular time. In some embodiments, some virtual machines may have a priority level while others do not. In such a case, amounts of primary memory mapped to the guest memory of a virtual machine without a priority level may be greater than, or less than, the amounts of memory mapped to the guest memory of a virtual machine with a priority level FIG. 8 illustrates a logical arrangement of a set of general components of an example computing device 800. In this example, the device includes a processor 802 for executing instructions that can be stored in a memory device or element 804. As would be apparent to one of ordinary skill in the art, the device can include many types of memory, data storage, or non-transitory computer-readable storage media, such as a first data storage for program instructions for execution by the processor 802, a separate storage for images or data, a removable memory for sharing information with other devices, etc. The device typically will include some type of display element 806, such as a touch screen or liquid crystal display (LCD), although devices such as portable media players might convey information via other means, such as through audio speakers. As discussed, the device in many embodiments will include at least one input element 808 able to receive conventional input from a user. This conventional input can include, for example, a push button, touch pad, touch screen, wheel, joystick, keyboard, mouse, keypad, or any other such device or element whereby a user can input a command to the device. In some embodiments, however, such a device might not include any buttons at all, and might be controlled only through a combination of visual and audio commands, such that a user can control the device without having to be in contact with the device. In some embodiments, the computing device 800 of FIG. 8 can include one or more network interface elements 808 for communicating over various networks, such as a Wi-Fi, Bluetooth, RF, wired, or wireless communication systems. The device in many embodiments can communicate with a network, such as the Internet, and may be able to communicate with other such devices.

Figure 9:
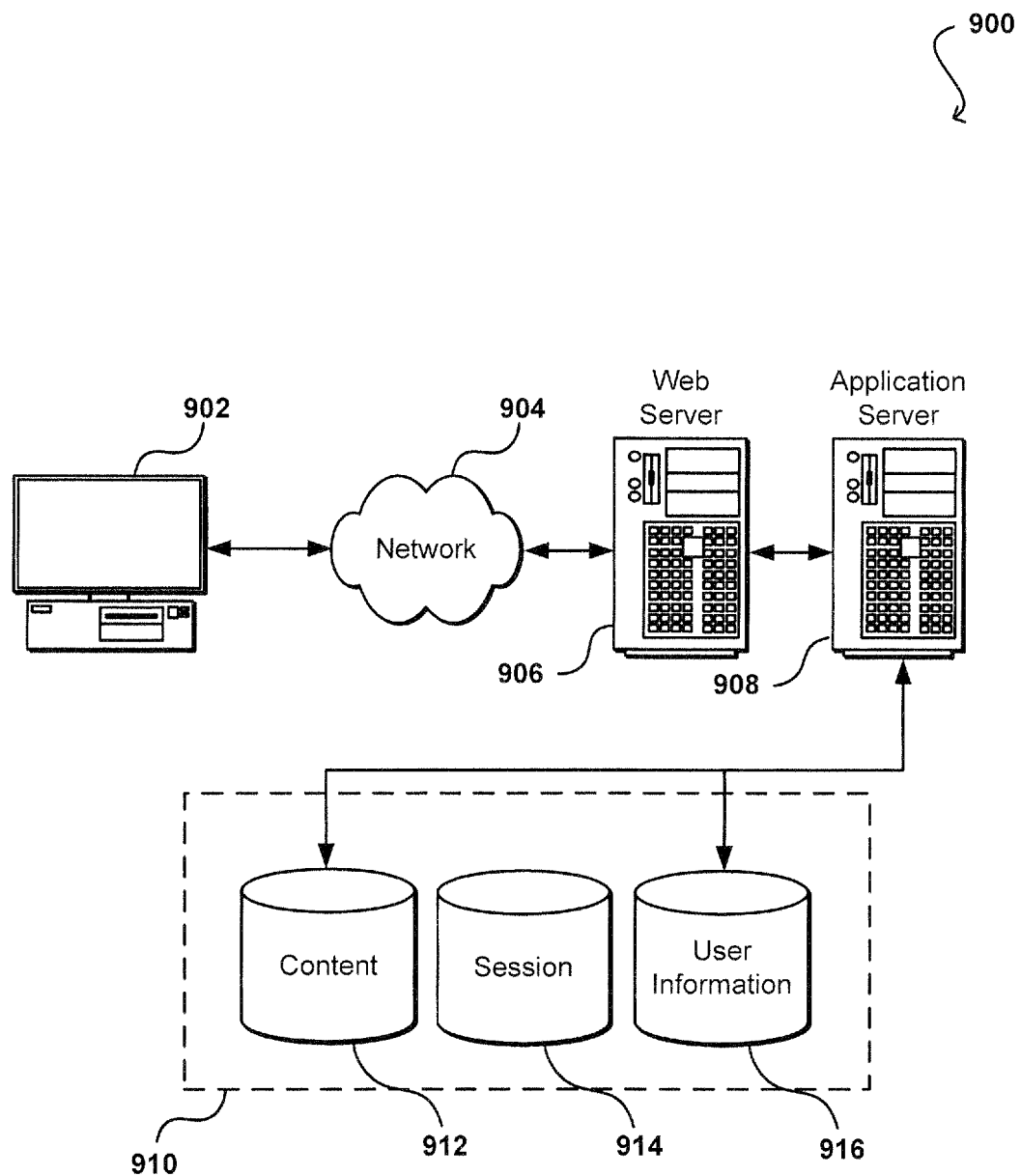
FIG. 9 illustrates an example of an environment for implementing aspects in accordance with various embodiments.

As discussed, different approaches can be implemented in various environments in accordance with the described embodiments. For example, FIG. 9 illustrates an example of an environment 900 for implementing aspects in accordance with various embodiments. As will be appreciated, although a Web-based environment is used for purposes of explanation, different environments may be used, as appropriate, to implement various embodiments. The system includes an electronic client device 902, which can include any appropriate device operable to send and receive requests, messages or information over an appropriate network 904 and convey information back to a user of the device. Examples of such client devices include personal computers, cell phones, handheld messaging devices, laptop computers, set-top boxes, personal data assistants, electronic book readers and the like. The network can include any appropriate network, including an intranet, the Internet, a cellular network, a local area network or any other such network or combination thereof. Components used for such a system can depend at least in part upon the type of network and/or environment selected. Protocols and components for communicating via such a network are well known and will not be discussed herein in detail. Communication over the network can be enabled via wired or wireless connections and combinations thereof. In this example, the network includes the Internet, as the environment includes a Web server 906 for receiving requests and serving content in response thereto, although for other networks an alternative device serving a similar purpose could be used, as would be apparent to one or ordinary skill in the art.

The illustrative environment includes at least one application server 908 and a data store 910. It should be understood that there can be several application servers, layers or other elements, processes or components, which may be chained or otherwise configured, which can interact to perform tasks such as obtaining data from an appropriate data store. As used herein the term "data store" refers to any device or combination of devices capable of storing, accessing and retrieving data, which may include any combination and number of data servers, databases, data storage devices and data storage media, in any standard, distributed or clustered environment. The application server can include any appropriate hardware and software for integrating with the data store as needed to execute aspects of one or more applications for the client device and handling a majority of the data access and business logic for an application. The application server provides access control services in cooperation with the data store and is able to generate content such as text, graphics, audio and/or video to be transferred to the user, which may be served to the user by the Web server in the form of HTML, XML or another appropriate structured language in this example. The handling of all requests and responses, as well as the delivery of content between the client device 902 and the application server 908, can be handled by the Web server 906. It should be understood that the Web and application servers are not required and are merely example components, as structured code discussed herein can be executed on any appropriate device or host machine as discussed elsewhere herein.

The data store 910 can include several separate data tables, databases or other data storage mechanisms and media for storing data relating to a particular aspect. For example, the data store illustrated includes mechanisms for storing production data 912 and user information 916, which can be used to serve content for the production side. The data store also is shown to include a mechanism for storing log or session data 914. It should be understood that there can be many other aspects that may need to be stored in the data store, such as page image information and access rights information, which can be stored in any of the above listed mechanisms as appropriate or in additional mechanisms in the data store 910. The data store 910 is operable, through logic associated therewith, to receive instructions from the application server 908 and obtain, update or otherwise process data in response thereto. In one example, a user might submit a search request for a certain type of item. In this case, the data store might access the user information to verify the identity of the user and can access the catalog detail information to obtain information about items of that type. The information can then be returned to the user, such as in a results listing on a Web page that the user is able to view via a browser on the user device 902. Information for a particular item of interest can be viewed in a dedicated page or window of the browser.

Each server typically will include an operating system that provides executable program instructions for the general administration and operation of that server and typically will include computer-readable medium storing instructions that, when executed by a processor of the server, allow the server to perform its intended functions. Suitable implementations for the operating system and general functionality of the servers are known or commercially available and are readily implemented by persons having ordinary skill in the art, particularly in light of the disclosure herein.

The environment in one embodiment is a distributed computing environment utilizing several computer systems and components that are interconnected via communication links, using one or more computer networks or direct connections. However, it will be appreciated by those of ordinary skill in the art that such a system could operate equally well in a system having fewer or a greater number of components than are illustrated in FIG. 9. Thus, the depiction of the system 900 in FIG. 9 should be taken as being illustrative in nature and not limiting to the scope of the disclosure.

Various embodiments discussed or suggested herein can be implemented in a wide variety of operating environments, which in some cases can include one or more user computers, computing devices, or processing devices which can be used to operate any of a number of applications. User or client devices can include any of a number of general purpose personal computers, such as desktop or laptop computers running a standard operating system, as well as cellular, wireless, and handheld devices running mobile software and capable of supporting a number of networking and messaging protocols. Such a system also can include a number of workstations running any of a variety of commercially-available operating systems and other known applications for purposes such as development and database management. These devices also can include other electronic devices, such as dummy terminals, thin-clients, gaming systems, and other devices capable of communicating via a network.

Most embodiments utilize at least one network that would be familiar to those skilled in the art for supporting communications using any of a variety of commercially-available protocols, such as TCP/IP, FTP, UPnP, NFS and CIFS. The network can be, for example, a local area network, a wide-area network, a virtual private network, the Internet, an intranet, an extranet, a public switched telephone network, an infrared network, a wireless network, and any combination thereof.

In embodiments utilizing a Web server, the Web server can run any of a variety of server or mid-tier applications, including HTTP servers, FTP servers, CGI servers, data servers, Java servers, and business application servers. The server(s) also may be capable of executing programs or scripts in response requests from user devices, such as by executing one or more Web applications that may be implemented as one or more scripts or programs written in any programming language, such as Java®, C, C# or C++, or any scripting language, such as Perl, Python, or TCL, as well as combinations thereof. The server(s) may also include database servers, including without limitation those commercially available from Oracle®, Microsoft®, Sybase®, and IBM®.

The environment can include a variety of data stores and other memory and storage media as discussed above. These can reside in a variety of locations, such as on a storage medium local to (and/or resident in) one or more of the computers or remote from any or all of the computers across the network. In a particular set of embodiments, the information may reside in a storage-area network ("SAN") familiar to those skilled in the art. Similarly, any necessary files for performing the functions attributed to the computers, servers, or other network devices may be stored locally and/or remotely, as appropriate. Where a system includes computerized devices, each such device can include hardware elements that may be electrically coupled via a bus, the elements including, for example, at least one central processing unit (CPU), at least one input device (e.g., a mouse, keyboard, controller, touch screen, or keypad), and at least one output device (e.g., a display device, printer, or speaker). Such a system may also include one or more storage devices, such as disk drives, optical storage devices, and solid-state storage devices such as random access memory ("RAM") or read-only memory ("ROM"), as well as removable media devices, memory cards, flash cards, etc.

Such devices also can include a computer-readable storage media reader, a communications device (e.g., a modem, a network card (wireless or wired), an infrared communication device, etc.), and working memory as described above. The computer-readable storage media reader can be connected with, or configured to receive, a computer-readable storage medium, representing remote, local, fixed, and/or removable storage devices as well as storage media for temporarily and/or more permanently containing, storing, transmitting, and retrieving computer-readable information. The system and various devices also typically will include a number of software applications, modules, services, or other elements located within at least one working memory device, including an operating system and application programs, such as a client application or Web browser. It should be appreciated that alternate embodiments may have numerous variations from that described above. For example, customized hardware might also be used and/or particular elements might be implemented in hardware, software (including portable software, such as applets), or both. Further, connection to other computing devices such as network input/output devices may be employed.

Storage media and computer readable media for containing code, or portions of code, can include any appropriate media known or used in the art, including storage media and communication media, such as but not limited to volatile and non-volatile, removable and non-removable media implemented in any method or technology for storage and/or transmission of information such as computer readable instructions, data structures, program modules, or other data, including RAM, ROM, EEPROM, flash memory or other memory technology, CD-ROM, digital versatile disk (DVD) or other optical storage, magnetic cassettes, magnetic tape, magnetic disk storage or other magnetic storage devices, or any other medium which can be used to store the desired information and which can be accessed by a system device. Based on the disclosure and teachings provided herein, a person of ordinary skill in the art will appreciate other ways and/or methods to implement the various embodiments.

The specification and drawings are, accordingly, to be regarded in an illustrative rather than a restrictive sense. It will, however, be evident that various modifications and changes may be made thereunto without departing from the broader spirit and scope of the invention as set forth in the claims.

What is claimed is:

1. A non-transitory computer readable storage medium storing one or more sequences of instructions, which when executed by one or more processors to cause a computing system to:
   cause a virtual machine manager to launch a first virtual machine configured to use excess random access memory (RAM), the first virtual machine having a first portion of first guest memory mapped to random access memory (RAM) and a second portion of the first guest memory mapped to secondary storage;
   monitor usage of second guest memory of a second virtual machine, wherein a first portion of the second guest memory is mapped to the RAM and a second portion of the second guest memory is mapped to the secondary storage;
   in response to determining that usage of the second guest memory is higher than a threshold, progressively decrease the amount of second guest memory of the second virtual machine mapped to RAM and progressively increase the amount of second guest memory mapped to secondary storage; and
   progressively increase the first portion of the first guest memory mapped to RAM.

2. The non-transitory computer readable storage medium of claim 1, wherein the one or more processors further cause a computing system to:
   determine whether RAM is available at a second host computing device; and
   in response to determining that RAM is available at a second host computing device, migrate the second virtual machine to the second host computing device.

3. The non-transitory computer readable storage medium of claim 1, wherein the one or more processors further cause a computing system to:
   assign a first priority level to the first virtual machine and a second priority level to the second virtual machine, wherein amounts of RAM mapped to the first guest memory and to the second guest memory are based at least in part on the first priority level and the second priority level.

4. A system, comprising:
   a computer system including one or more processors coupled to a memory device including instructions that, when executed by the one or more processors, cause the computing system to:
   determine that usage of guest memory of a first instance exceeds a constraint;
   progressively reallocate primary memory mapped to guest memory of the first instance to a memory pool based at least in part on determining that the usage of the guest memory of the first instance exceeds the constraint; and
   progressively map at least a portion of the primary memory of the memory pool to guest memory of a second instance.

5. The computing system of claim 4, wherein the memory device further includes instructions that, when executed by the one or more processors, cause the computing system to:
   receive a request to launch the second instance, the second instance associated with information that indicates that the second instance uses excess primary memory of the computer system.

6. The computing system of claim 4, wherein the memory device further includes instructions that, when executed by the one or more processors, cause the computing system to:
   progressively map at least a portion of the guest memory of the first instance to secondary storage.

7. The computing system of claim 4, wherein the constraint is expressed in a policy associated with a customer that controls the instance.

8. The computing system of claim 4, further comprising:
   a web server including one or more processors coupled to a memory device including instructions that, when executed by the one or more processors, cause the web server to:
   receive a web services application program interface request to launch the second instance, the request indicating that the second instance uses excess primary memory; and
   cause the computer system to launch the second instance.

9. The computing system of claim 4, wherein the memory device further includes instructions that, when executed by the one or more processors, cause the system to:
   assign a first priority level to the first instance and a second priority level to the second instance, wherein amounts of the primary memory mapped to the guest memory of the first instance and to the guest memory of the second instance are based at least in part on the first priority level and the second priority level.

10. The computing system of claim 4, wherein the memory device further includes instructions that, when executed by the one or more processors, cause the system to:
configure a virtual machine manager to reallocate all guest memory mapped to secondary storage to the primary memory, wherein the guest memory mapped to the secondary storage is mapped to the primary memory based at least in part on an amount of primary memory available.

11. The computing system of claim 4, wherein the memory device further includes instructions that, when executed by the one or more processors, cause the system to:
pause execution of the second instance when an amount of primary memory mapped to the guest memory of the second instance is lower than a threshold.

12. The computing system of claim 11, wherein the instructions that, when executed by the one or more processors, cause the system to pause execution of the second instance further comprise instructions that cause the system to hibernate the second instance.

13. The computing system of claim 4, wherein the memory device further includes instructions that, when executed by the one or more processors, cause the system to:
map primary memory mapped to guest memory of the first instance in response to determining that usage of the guest memory of the first instance is lower than a second threshold.

14. The computing system of claim 13, wherein the memory device further includes instructions that, when executed by the one or more processors, cause the system to:
reallocate primary memory mapped to the guest memory of the second instance to the memory pool in response to determining that the amount of primary memory in the memory pool is lower than a memory pool threshold.

15. A computer implemented method, comprising:
causing a virtual machine manager to launch a first virtual machine configured to use excess primary memory, the first virtual machine having a portion of first guest memory mapped to primary memory and a second portion of the first guest memory mapped to secondary storage;
monitoring usage of second guest memory of a second virtual machine, wherein a first portion of the second guest memory is mapped to primary memory and a second portion of the second guest memory is mapped to the secondary storage;
in response to determining that usage of the second guest memory is higher than a threshold, decreasing the amount of second guest memory of the second virtual machine mapped to primary memory and increasing the amount of second guest memory mapped to secondary storage; and
increasing the first potion of the first guest memory mapped to primary memory.

16. The computer implemented method of claim 15, further comprising:
determining whether primary memory is available at a second host computing device; and
in response to determining that primary memory is available at a second host computing device, migrating the second virtual machine to the second host computing device.

17. The computer implemented method of claim 15, further comprising:
assigning a first priority level to the first virtual machine and a second priority level to the second virtual machine, wherein amounts of primary memory mapped to the first guest memory and to the second guest memory are based at least in part on the first priority level and the second priority level.

18. The computer implemented method of claim 15, further comprising:
receiving a web services application program interface request to launch the first virtual machine, the request indicating that the first virtual machine uses excess primary memory.

19. The computer implemented method of claim 15, wherein execution of the first virtual machine is paused in response to determining that the amount of first guest memory mapped to primary memory is lower than a threshold.

20. The computer implemented method of claim 15, wherein threshold is expressed in a policy associated with a customer that controls the first virtual machine.

\* \* \* \* \*